May 19, 1959 J. L. SCIURBA 2,887,574

TRANSISTOR OSCILLATOR

Filed Dec. 28, 1956

INVENTOR.
Jack L. Sciurba

BY Mueller & Aichele
Attys.

2,887,574

United States Patent Office 2,887,574

Patented May 19, 1959

2,887,574

TRANSISTOR OSCILLATOR

Jack L. Sciurba, Chicago, Ill., assignor to Motorola, Inc., Chicago, Ill., a corporation of Illinois Application December 28, 1956, Serial No. 631,127

3 Claims. (Cl. 250—20)

Figures 1, 2:
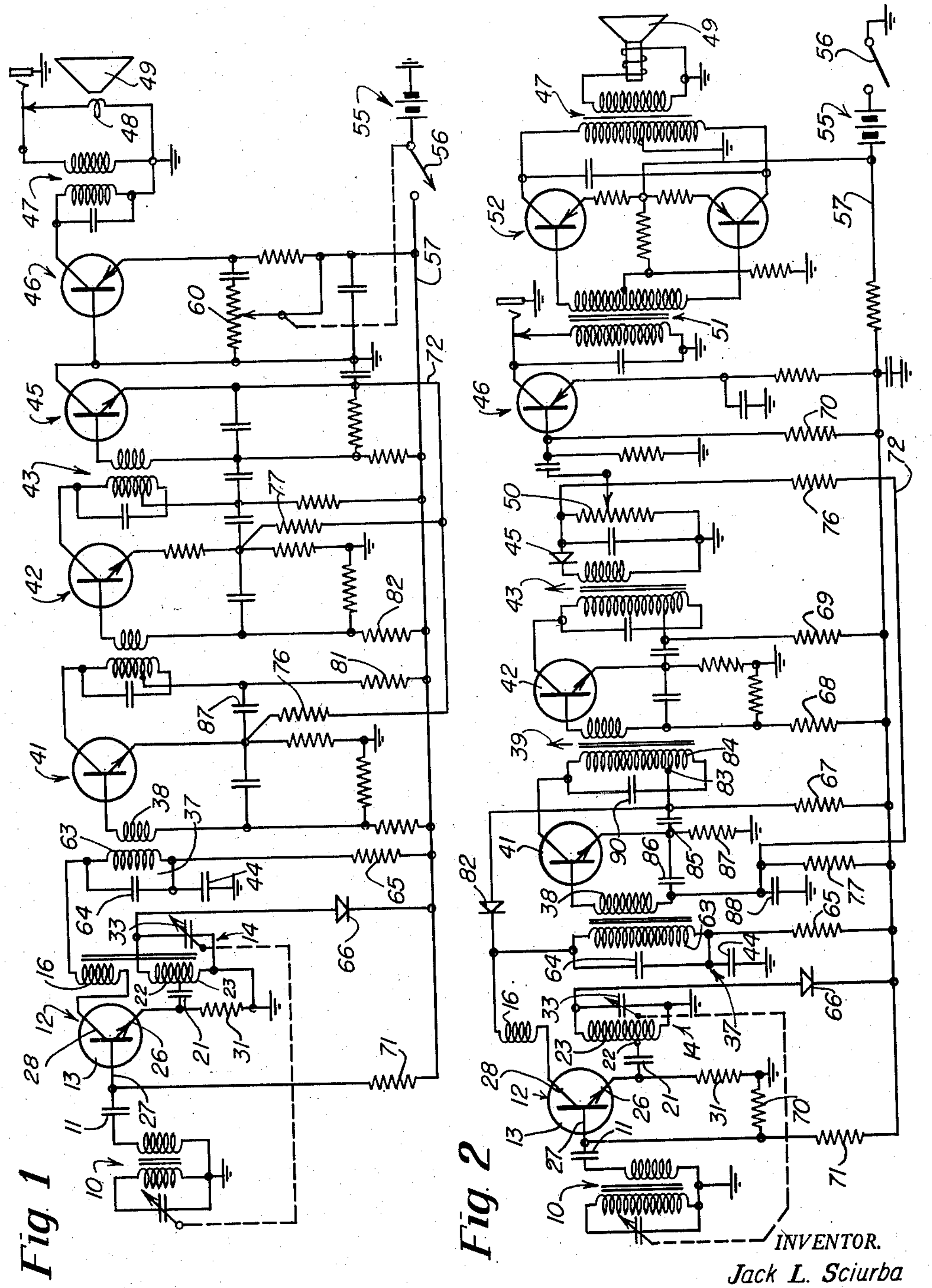

This invention relates to transistor circuits, and more particularly to transistor frequency converter circuits for use in radio receivers.

In the use of transistor converter stages in radio receivers in which there is a tank circuit coupled to the output of the converter stage, the coupling must be sufficiently strong that oscillations are maintained but not be so strong that blocking or the like occurs. For a transistor of any given gain, the coupling may be designed to fall between these extremes. However, where transistors of a given type are manufactured in mass production, the gain of the transistors may vary widely so that the coupling is not satisfactory for all cases. This requires adjustment at the tank circuit for each transistor which is undesirable. There also is a problem in transistor radio circuits of preventing overloading of stages therein from strong signals without reducing the sensitivity of the circuits when weak or normal signals are received.

An object of the invention is to provide a transistor converter circuit wherein strong oscillations are produced but in which the amplitude of the oscillators are held to a predetermined limit.

Another object of the invention is to provide an improved transistor converter circuit in which transistors of widely varying gain may be substituted one for another therein.

A further object of the invention is to provide a circuit for limiting a transistor amplifier stage on strong signals without affecting the same for signals or normal strength.

One feature of the invention is the provision of a transistor oscillator having a limiting circuit across the tank circuit thereof to limit the amplitude of oscillations therein.

Another feature of the invention is the provision of a transistor converter circuit including an oscillator circuit loaded by a rectifying diode biased to conduct when the oscillations reach a predetermined level to drain off peaks of power in the tank circuit.

A further feature of the invention is the provision of a transistor radio circuit having a converter stage in which the oscillator circuit is loaded by a diode to limit the amplitude of oscillations, and in which the output circuit is loaded by another diode supplied with a bias voltage proportional to the strength of the converter output signal so that the output of the stage is limited.

In the drawings:

Fig. 1 is a wiring diagram of a radio receiver circuit forming one embodiment of the invention; and Fig. 2 is a wiring diagram of a radio circuit forming a second embodiment of the invention.

The invention provides a radio receiver including a converter stage having a transistor and a tank circuit connected to one of the electrodes and coupled to another of the electrodes so that oscillations are sustained therein. The tank circuit is connected to the B+ power supply of a diode connected in such a manner that it drains off excess energy from the tank circuit to limit the amplitude of oscillations in the converter stage. The converter stage has a tuned output circuit which is connected by a diode to a succeeding amplifier stage which is controlled by an automatic gain control circuit. The diode is connected to conduct when the gain of the succeeding stage is reduced because of strong received signals to load the tuned circuit and thereby cut down the converter output so that overloading of succeeding stages is prevented.

The transistor radio circuit shown in Fig. 1 includes an antenna circuit 10 including a signal pickup coil tuned by a variable capacitor and coupled through a secondary winding and a capacitor 11 to a converter stage 12 including a transistor 13 and a tank circuit 14, ganged-tuned with the antenna circuit 10. The tank circuit 14 includes coil 23 and variable capacitor 33. A feedback winding 16 in the output circuit of the converter stage 16 is inductively coupled to coil 23 and supplies the tank circuit 14 with energy to sustain oscillations in the converter circuit. A radio frequency coupling capacitor 21 connects a tap 22 of the coil 23 of the circuit 14 to the emitter 26 of the transistor 13. The converter stage 12 is of common emitter type with a base 27 and the emitter 26 forming an input circuit and the emitter 26 and a collector 28 forming the output circuit of the stage 12. A resistor 31 connects the emitter 26 to ground, and the lower ends of the coil 23, and capacitor 33 is also connected to ground.

The converter stage 12 also includes a tuned output circuit 37 including coil 63 and capacitor 64 coupled to ground by a capacitor 44. The coil 63 applies the modulated intermediate frequency wave through a secondary winding 38 to an intermediate frequency amplifier transistor stage 41, and the stage 41 amplifies the modulated intermediate frequency signal and applies it to a second intermediate frequency amplifier stage 42 which applies its output to an output transformer 43. The signal-modulated, intermediate frequency waves are applied to a detector transistor stage 45 which applies its output to an audio frequency amplifier stage 46 driving an output transformer 47 actuating a voice coil 48 of a loudspeaker 49.

A battery 55 is connected through a switch 56 to a B+ line 57. The switch may be combined with a volume control potentiometer 60 connected to the detector stage 45. The line 57 supplies bias potentials to the transistors of the receiver. An automatic gain control line 72 supplies control voltage from the detector stage 45 to the intermediate frequency amplifier stage 41 and 42 through resistors 76 and 77. A diode 66 is connected from the high side of the coil 23 and the capacitor 33 of the tank circuit 14 to the line 57. This diode conducts when the amplitude of oscillations exceeds the potential on line 57 to limit the amplitude thereof.

In order to provide oscillations at an amplitude which will produce proper converter action, the oscillator coupling is made strong. The diode 66 which acts to cut off peaks of energy in the tank circuit 14 so that the output of the stage 12 is not such that overloading of the intermediate frequency stage 41 will occur. By providing strong oscillator coupling, oscillations will be produced even when the transistor used has low gain, and for transistors having high gain, the output is held within the required limits.

The following circuits constants for the circuit shown in Fig. 1 are given merely by way of example and are not intended to limit the scope of the invention in any way:

| | |
|---|---|
| Resistor **31** | 1.5 kilohms. |
| Resistor **65** | 470 ohms. |
| Resistor **70** | 33 kilohms. |
| Resistor **71** | 100 kilohms. |
| Resistor **76** | 2.2 kilohms. |
| Resistor **77** | 3.9 kilohms. |
| Resistor **81** | 470 ohms. |
| Capacitor **11** | .04 microfarads. |
| Capacitor **21** | .01 microfarads. |
| Capacitor **33** | 7 to 85 micromicrofarads. |
| Capacitor **44** | .01 microfarads. |
| Capacitor **64** | 390 micromicrofarads. |
| Capacitor **87** | .01 microfarads. |
| Transistor **13** | Type 2N172. |
| Transistor **41** | Type 2N146. |
| Transistor **42** | Type 2N146. |
| Transistor **45** | Type R35. |
| Transistor **46** | Type 354. |
| Diode **66** | Type 1N66. |

The transistor radio circuit shown in Fig. 2 is generally similar to that shown in Fig. 1, and includes an antenna circuit 10 coupled by a capacitor 11 to converter stage 12 including a transistor 13 and a tank circuit 14 to gang-tuned with the antenna circuit 10. A feedback winding 16 in the output circuit of the converter stage 16 is coupled to and supplies the tank circuit 14 with energy to sustain oscillations in the converter circuit. A radio frequency coupling capacitor 21 connects a tap 22 of a coil 23 of the circuit 14 to an emitter 26 of the transistor 13. The converter stage 12 is a common emitter circuit with a base 27 forming an input circuit with the emitter 26, and emitter 26, and a collector 28 form the output circuit of the stage 12. A resistor 31 connects the emitter 26 to ground, and the lower end of the coil 23 is also connected to ground. The tank circuit 14 also includes a variable capacitor 33.

The converter stage 12 also includes a tuned output circuit 37 which applies the intermediate frequency wave through a secondary winding 38 to an intermediate frequency amplifier transistor stage 41, and the stage 41 amplifies the modulated intermediate frequency signal and applies it through a transformer 39 to a second intermediate frequency amplifier stage 42 which applies its output to a transformer 43. The signal modulated intermediate frequency waves are applied to a diode detector 45, and the detected signal, whose amplitude is controlled by a volume control potentiometer 50, is applied to an audio amplifier stage 46. The stage 46 has a transformer 51 in its output, the center-tapped secondary of which forms the input of a push-pull power amplifier stage 52. The stage 52 is coupled through transformer 47 to voice coil 48 of a loudspeaker 49. A battery 55 is connected through a switch 56 to a B+ powerline 57, which supplies power to the several stages. The powerline 57 is connected by a diode 66 to the high or ungrounded side of the coil 23 and the capacitor 33 of the tank circuit 14. An automatic gain control line 72 supplies control voltage from the detector stage 45 to the base of the intermediate frequency amplifier stage 41 through resistor 76. A diode 82 connects a tap 83 of the primary winding 84 of the transformer 39 to the tuned circuit 37.

As previously stated, the diode 66 acts to limit to a selected maximum level oscillation in the tank circuit 14. The diode 66 connected from the high side of the tuned circuit 14 to the B+ powerline 57 serves to provide a load for the circuit 14 so that the amplitude of oscillations of the converter stage 12 is limited. The diode 82 which connects the output of the stage 41 to the tuned output circuit 37 of the converter stage 12 acts to limit the signals therein to prevent overloading of the stage 41 during periods of high gain. The diode 82 conducts when the signal at the tap 83 exceeds the potential across the output circuit 37 to load the output circuit. The voltage at tap 83 increases on strong signals because of the A.V.C. actions. Accordingly the output of the converter is limited on strong signals but provides full gain on weaker signals.

The following circuit constants for the circuit shown in Fig. 2 are given merely by way of example and are not intended to limit the scope of the invention in any way:

| | |
|---|---|
| Resistor **67** | 2,200 ohms. |
| Resistor **68** | 10,000 ohms. |
| Resistor **69** | 470 ohms. |
| Resistor **70** | 10,000 ohms. |
| Resistor **87** | 1,000 ohms. |
| Capacitor **85** | .01 microfarad. |
| Capacitor **86** | .01 microfarad. |
| Capacitor **88** | 6 microfarads. |
| Transistor **13** | Type 2N172. |
| Transistor **41** | Type 2N146. |
| Transistor **42** | Type 2N146. |
| Transistor **46** | Type 2N185. |
| Transistor **52** | Type 2N185. |
| Diode **45** | Type 1N295. |
| Diode **66** | Type 1N66. |
| Diode **82** | Type 1N66. |

The above-described converter circuit permits transistors to be interchanged without adaption of the circuit for varying strengths of the transistors. Also, the diode 82 serves to prevent overloading of the intermediate frequency amplifier stages while maintaining full sensitivity for the weaker signals.

I claim:

1. In a transistor radio receiver, the combination including a signal source, a transistor converter stage driven by said signal source and having a tuned tank circuit for causing local oscillations and also being provided with an output circuit, said tank circuit including in parallel a coil and a capacitor grounded at one side, said coil including a tap coupled to the input of said converter stage, a feedback winding connected in said output circuit and inductively coupled to said coil, a direct current voltage source, and diode means connecting the other side of said coil and said capacitor to said voltage source to bias said diode means and load said tank circuit when oscillations cause conduction of said diode means.

2. In a superheterodyne radio receiver having an energization circuit providing a direct current fixed voltage with respect to a reference point; a transistor converter stage including in combination, a transistor, a first variable tuned circuit coupled to said transistor to provide input signals thereto, an output circuit coupled to the energization circuit and to said transistor to provide signals of intermediate frequency therefrom, a feedback circuit coupled to said transistor to sustain oscillations, said feedback circuit having a second variable tuned circuit having inductor means and capacitor means and ganged with said first tuned circuit at resonant frequencies differing from those of said input signals by the intermediate frequency, means coupling said inductor means of said second tuned circuit to the reference point, and a diode coupled between said inductor means of said second tuned circuit and the energization circuit, said diode being poled so that the direct current voltage provides reverse bias therefor, whereby variation of the amplitude of oscillations in said feedback circuit is minimized by conduction of said diode when the bias therefor is exceeded.

3. In a superheterodyne transistor radio receiver, a transistor converter stage including in combination, an input circuit adapted to provide a radio frequency signal, an output circuit to conduct an intermediate frequency signal, a transistor, a feedback network connected in regenerative relation with said transistor and including a resonant tank circuit having inductor means in which oscillations occur, diode means connected in a signal conduction path across at least a portion of said inductor means, and direct current fixed voltage supply means connected to said diode means and poled to provide a reverse fixed bias therefor, whereby said diode means loads said resonant tank circuit when the amplitude of oscillations in said inductor means exceeds the reversed fixed bias and causes conduction of said diode means.

References Cited in the file of this patent

UNITED STATES PATENTS

| | | |
|---|---|---|
| 2,340,429 | Rankin | Feb. 1, 1944 |
| 2,623,955 | Van Elst | Dec. 30, 1952 |
| 2,632,853 | Lindley et al. | Mar. 24, 1953 |
| 2,774,866 | Buger | Dec. 18, 1956 |

FOREIGN PATENTS

| | | |
|---|---|---|
| 645,685 | Germany | June 2, 1937 |

OTHER REFERENCES

Article: "Japanese Portable Uses Five Transistors," Electronics magazine, October 1955, page 12.

Article: "Japanese Transistor Broadcast Receiver," Electronics magazine, December 1955, page 174.

Publication I: "An Amplitude Stabilized Transistor Oscillator," by Kretzmer, Proc. IRE, February 1954, pages 391–400.

Publication II: "1936 Transistor Portable Design," in Tele-Tech and Electronic Industries, April 1956, page 100.